(12) United States Patent
King et al.

(10) Patent No.: US 10,566,534 B2
(45) Date of Patent: Feb. 18, 2020

(54) APPARATUS AND METHOD TO DELIVER ORGANIC MATERIAL VIA ORGANIC VAPOR-JET PRINTING (OVJP)

(71) Applicant: Universal Display Corporation, Ewing, NJ (US)

(72) Inventors: Matthew King, Evesham, NJ (US); William E. Quinn, Whitehouse Station, NJ (US); Gregory McGraw, Yardley, PA (US); Siddharth Harikrishna Mohan, Plainsboro, NJ (US); Elliot H. Hartford, Jr., Morristown, NJ (US); Benjamin Swedlove, Churchville, PA (US); Gregg Kottas, Ewing, NJ (US); Tomasz Trojacki, Keyport, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/291,756

(22) Filed: Oct. 12, 2016

(65) Prior Publication Data
US 2017/0104159 A1    Apr. 13, 2017

Related U.S. Application Data

(60) Provisional application No. 62/240,198, filed on Oct. 12, 2015.

(51) Int. Cl.
C23C 14/12    (2006.01)
C23C 14/24    (2006.01)
(Continued)

(52) U.S. Cl.
CPC .......... *H01L 51/0013* (2013.01); *C23C 14/12* (2013.01); *C23C 14/228* (2013.01);
(Continued)

(58) Field of Classification Search
CPC .................. H01L 51/0013; C23C 14/243
(Continued)

(56) References Cited

U.S. PATENT DOCUMENTS 4,413,022 A    11/1983  Suntola et al.
4,769,292 A    9/1988   Tang et al.
(Continued)

FOREIGN PATENT DOCUMENTS

CN    1366333       8/2002
JP    2009124061    6/2009
(Continued)

OTHER PUBLICATIONS

Baldo, "Highly efficient phosphorescent emission from organic electroluminescent devices," Nature, vol. 395, pp. 151-154, 1998.
(Continued)

*Primary Examiner* — Aiden Lee
(74) *Attorney, Agent, or Firm* — Morris & Kamlay LLP

(57) ABSTRACT

Systems and arrangements of OVJP deposition devices are provided, in which one or more organic material crucibles are directly attached to an injection block and a print head without the need for external delivery components such as feedtubes. Each crucible may be hermetically sealed until it is attached to the injection block, allowing for a single device to provide for storage, transport, and deposition of the organic material.

20 Claims, 10 Drawing Sheets

(51) Int. Cl.
   *H01L 51/56* (2006.01)
   *H01L 51/00* (2006.01)
   *H01L 51/50* (2006.01)
   *H01L 51/52* (2006.01)
   *C23C 14/22* (2006.01)

(52) U.S. Cl.
   CPC .......... *C23C 14/243* (2013.01); *H01L 51/008* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01); *H01L 51/5253* (2013.01); *H01L 51/56* (2013.01); *H01L 2251/5353* (2013.01)

(58) Field of Classification Search
   USPC .................................................. 118/726, 727
   See application file for complete search history.

(56) References Cited

U.S. PATENT DOCUMENTS

| | | | |
|---|---|---|---|
| 5,247,190 A | 9/1993 | Friend et al. | |
| 5,579,040 A | 11/1996 | Sato et al. | |
| 5,703,436 A | 12/1997 | Forrest et al. | |
| 5,707,745 A | 1/1998 | Forrest et al. | |
| 5,824,157 A | 10/1998 | Foster et al. | |
| 5,834,893 A | 11/1998 | Bulovic et al. | |
| 5,844,363 A | 12/1998 | Gu et al. | |
| 5,863,337 A | 1/1999 | Neuman et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,139,639 A | 10/2000 | Kitamura et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,530,823 B1 | 3/2003 | Ahmadi et al. | |
| 6,550,990 B2 | 4/2003 | Sakurai | |
| 6,749,906 B2 | 6/2004 | Van Slyke | |
| 7,067,170 B2 | 6/2006 | Marcus et al. | |
| 7,279,704 B2 | 10/2007 | Walters et al. | |
| 7,404,862 B2 | 7/2008 | Shtein et al. | |
| 7,431,968 B1 | 10/2008 | Shtein et al. | |
| 7,503,977 B1 | 3/2009 | O'Donnell et al. | |
| 7,530,778 B2 | 5/2009 | Yassour | |
| 7,603,028 B2 | 10/2009 | Yassour | |
| 7,604,439 B2 | 10/2009 | Yassour | |
| 7,682,660 B2 | 3/2010 | Shtein et al. | |
| 7,744,957 B2 | 6/2010 | Forrest et al. | |
| 7,857,121 B2 | 12/2010 | Yassour | |
| 7,879,410 B2 | 2/2011 | Che et al. | |
| 7,897,210 B2 | 3/2011 | Shtein et al. | |
| 7,908,885 B2 | 3/2011 | Devitt | |
| 7,968,146 B2 | 6/2011 | Wagner et al. | |
| 8,293,329 B2 | 10/2012 | Forrest | |
| 8,613,496 B2 | 12/2013 | Forrest et al. | |
| 8,728,858 B2 | 5/2014 | Mohan et al. | |
| 8,851,597 B2 | 10/2014 | Forrest | |
| 8,944,309 B2 | 2/2015 | Forrest et al. | |
| 2002/0081118 A1 | 6/2002 | Sakurai | |
| 2002/0088399 A1 | 7/2002 | Noji et al. | |
| 2003/0032289 A1 | 2/2003 | Martin | |
| 2003/0037729 A1 | 2/2003 | DeDontney et al. | |
| 2003/0075204 A1 | 4/2003 | de Larios et al. | |
| 2003/0159651 A1 | 8/2003 | Sakurada | |
| 2003/0175414 A1 | 9/2003 | Hayashi | |
| 2003/0230980 A1 | 12/2003 | Forrest et al. | |
| 2004/0003778 A1 | 1/2004 | Hayashi | |
| 2004/0009303 A1 | 1/2004 | Ito et al. | |
| 2004/0035358 A1 | 2/2004 | Basceri et al. | |
| 2004/0048000 A1 | 3/2004 | Shtein | |
| 2004/0056244 A1 | 3/2004 | Marcus | |
| 2004/0062856 A1 | 4/2004 | Marcus | |
| 2004/0067641 A1 | 4/2004 | Yudovsky | |
| 2004/0082183 A1 | 4/2004 | Mori | |
| 2004/0099213 A1 | 5/2004 | Adomaitis | |
| 2004/0106072 A1 | 6/2004 | Itoh et al. | |
| 2004/0174116 A1 | 9/2004 | Lu et al. | |
| 2004/0207800 A1 | 10/2004 | Hiruma et al. | |
| 2004/0224433 A1 | 11/2004 | Yamazaki | |
| 2005/0011752 A1 | 1/2005 | Yamazaki et al. | |
| 2005/0045096 A1 | 3/2005 | Kojima | |
| 2005/0079639 A1 | 4/2005 | Itoh | |
| 2005/0081996 A1 | 4/2005 | Itoh | |
| 2005/0087767 A1 | 4/2005 | Fitzgerald et al. | |
| 2005/0106511 A1 | 5/2005 | Itoh | |
| 2005/0122351 A1 | 6/2005 | Yamazaki et al. | |
| 2005/0129339 A1 | 6/2005 | Sai et al. | |
| 2005/0214452 A1 | 9/2005 | Forrest | |
| 2005/0217137 A1 | 10/2005 | Smith et al. | |
| 2005/0242062 A1 | 11/2005 | Sakurai et al. | |
| 2006/0045958 A1* | 3/2006 | Abiko | C23C 14/12 427/66 |
| 2006/0115585 A1 | 6/2006 | Bulovic | |
| 2006/0162662 A1* | 7/2006 | Sato | C23C 14/243 118/726 |
| 2006/0165900 A1 | 7/2006 | Edwards et al. | |
| 2006/0172205 A1 | 8/2006 | Sakurai et al. | |
| 2007/0013736 A1 | 1/2007 | Higginson | |
| 2007/0019172 A1 | 1/2007 | Benson | |
| 2007/0031600 A1 | 2/2007 | Devitt | |
| 2007/0045562 A1 | 3/2007 | Parekh | |
| 2007/0228470 A1 | 10/2007 | Levy | |
| 2007/0238311 A1 | 10/2007 | Levy | |
| 2008/0102223 A1 | 5/2008 | Wagner et al. | |
| 2008/0152806 A1 | 6/2008 | Forrest | |
| 2008/0166884 A1 | 7/2008 | Nelson et al. | |
| 2008/0169427 A1* | 7/2008 | Hatem | C23C 14/246 250/429 |
| 2008/0173400 A1 | 7/2008 | Sakurai | |
| 2008/0260940 A1 | 10/2008 | Yoon et al. | |
| 2008/0308307 A1 | 12/2008 | Chang | |
| 2008/0311289 A1 | 12/2008 | Bulovic | |
| 2008/0311307 A1 | 12/2008 | Bulovic | |
| 2009/0004405 A1* | 1/2009 | Merry | C23C 16/4586 427/585 |
| 2009/0041929 A1 | 2/2009 | Ohmi | |
| 2009/0065776 A1 | 3/2009 | Scher | |
| 2009/0081885 A1 | 3/2009 | Levy et al. | |
| 2009/0087545 A1 | 4/2009 | Ohmi | |
| 2009/0101173 A1 | 4/2009 | Peng et al. | |
| 2009/0104377 A1 | 4/2009 | Yoshida et al. | |
| 2009/0110823 A1 | 4/2009 | Ohmi | |
| 2009/0128787 A1 | 5/2009 | Yamamoto et al. | |
| 2009/0151752 A1 | 6/2009 | Mui et al. | |
| 2009/0214783 A1 | 8/2009 | Forrest | |
| 2009/0217878 A1 | 9/2009 | Levy et al. | |
| 2009/0226604 A1 | 9/2009 | Ohmi et al. | |
| 2009/0291211 A1 | 11/2009 | Ryu | |
| 2009/0304924 A1 | 12/2009 | Gadgil | |
| 2010/0003396 A1 | 1/2010 | Verlee | |
| 2010/0097416 A1* | 4/2010 | Yoo | B41J 2/005 347/9 |
| 2010/0129737 A1 | 5/2010 | Sakurai et al. | |
| 2010/0171780 A1 | 7/2010 | Madigan | |
| 2010/0188457 A1 | 7/2010 | Madigan | |
| 2010/0201749 A1 | 8/2010 | Somekh | |
| 2010/0216077 A1 | 8/2010 | Nishi | |
| 2010/0245479 A1 | 9/2010 | Forrest | |
| 2010/0247766 A1 | 9/2010 | Forrest | |
| 2010/0269285 A1 | 10/2010 | Lin | |
| 2011/0007107 A1 | 1/2011 | Hoisington | |
| 2011/0008541 A1 | 1/2011 | Madigan et al. | |
| 2011/0023775 A1 | 2/2011 | Nunes | |
| 2011/0045196 A1 | 2/2011 | Forrest | |
| 2011/0059259 A1 | 3/2011 | Burrows et al. | |
| 2011/0086167 A1 | 4/2011 | Nunes et al. | |
| 2011/0092076 A1 | 4/2011 | Lang et al. | |
| 2011/0095198 A1 | 4/2011 | Smiljanic | |
| 2011/0097495 A1 | 4/2011 | Burrows et al. | |

(56) References Cited

U.S. PATENT DOCUMENTS

| | | |
|---|---|---|
| 2011/0117688 A1* | 5/2011 | Kitamura ............... C23C 14/12 438/46 |
| 2012/0003396 A1 | 1/2012 | Maas et al. |
| 2012/0125258 A1 | 5/2012 | Lee |
| 2012/0129296 A1 | 5/2012 | Rolin |
| 2012/0141676 A1 | 6/2012 | Sershen |
| 2012/0189766 A1 | 7/2012 | Rajala |
| 2012/0196050 A1 | 8/2012 | Vermeer et al. |
| 2012/0222620 A1 | 9/2012 | Yudovsky |
| 2012/0244644 A1 | 9/2012 | Wang |
| 2012/0248219 A1 | 10/2012 | Yoon |
| 2013/0005057 A1 | 1/2013 | Kim |
| 2013/0012029 A1 | 1/2013 | Vermeer et al. |
| 2013/0038649 A1 | 2/2013 | Lowrance et al. |
| 2013/0040061 A1 | 2/2013 | Lowrance |
| 2013/0043212 A1 | 2/2013 | De Graaf et al. |
| 2013/0065796 A1 | 3/2013 | Francis |
| 2013/0143415 A1 | 6/2013 | Yudovsky |
| 2013/0206058 A1 | 8/2013 | Mauck |
| 2013/0208036 A1 | 8/2013 | Forrest |
| 2013/0252533 A1 | 9/2013 | Mauck |
| 2013/0288402 A1 | 10/2013 | Morita et al. |
| 2013/0321535 A1 | 12/2013 | Mauck |
| 2013/0323934 A1 | 12/2013 | Wada |
| 2014/0020628 A1 | 1/2014 | Wang |
| 2014/0116331 A1 | 5/2014 | Forrest et al. |
| 2014/0138629 A1 | 5/2014 | Forrest et al. |
| 2014/0147587 A1 | 5/2014 | Endo |
| 2014/0199500 A1 | 7/2014 | van Kessel et al. |
| 2014/0220720 A1 | 8/2014 | Harikrishna Mohan et al. |
| 2014/0290567 A1 | 10/2014 | Mauck |
| 2014/0290579 A1* | 10/2014 | Lin ....................... C23C 14/243 118/726 |
| 2015/0011078 A1 | 1/2015 | Han |
| 2015/0361546 A1 | 12/2015 | Ochi |
| 2015/0368798 A1 | 12/2015 | Kwong |
| 2015/0376787 A1 | 12/2015 | McGraw et al. |
| 2015/0380648 A1 | 12/2015 | McGraw et al. |

FOREIGN PATENT DOCUMENTS

| | | |
|---|---|---|
| WO | WO-2008057394 A1 | 5/2008 |
| WO | WO-2009149563 A1 | 12/2009 |
| WO | WO-2010011390 A2 | 1/2010 |
| WO | WO-2010127328 A2 | 11/2010 |
| WO | WO-2011105898 A1 | 9/2011 |
| WO | WO-2012003440 A2 | 1/2012 |
| WO | 2014119548 A1 | 8/2014 |
| WO | 2014127363 A1 | 8/2014 |

OTHER PUBLICATIONS

Baldo, "Very high-efficiency green organic light-emitting devices based on electrophosphorescence," Applied Physics Letters, vol. 75, No. 1, pp. 4-6, Jul. 5, 1999.

M. S. Arnold, G. J. McGraw, S. R. Forrest and R. R. Lunt, "Direct vapor jet printing of three color segment organic light emitting devices for white light illumination," Applied Physics Letters 92 053301 (2008).

S. Biswas, K. P. Pipe, and M. Shtein Solvent-free, direct printing of organic semiconductors in atmosphere. App. Phys. Lett. 96 263301 (2010).

Office Action with Search Report for CN 201510359509 X dated Mar. 26, 2018, with partial English Translation.

Brochure NP-E10-5B. "Temperature Control Equipment." SMC Corporation of America. 2011. pp. 1-8.

Extended European Search Report dated Mar. 10, 2017 as received in Application No. EP15172150.3.

G.J., McGraw et al., "Organic vapor jet printing at micrometer resolution using microfluidic nozzle arrays", Applied Physics Letters 98, 013302 (2011).

Shtein, et al., "Direct mask and solvent-free printing of molecular organic semiconductors", Advanced Materials; 16 (18); pp. 1615-1620 (2004).

Yun, et al., "Digital-Mode Organic Vapor-Jet Printing (D-OVJP): Advanced Jet-on-Demand Control of Organic Thin-Film Deposition", Advanced Materials; c. 2012; vol. 24; pp. 2857-2862.

Notice of Reason for Rejection for JP 2015-121671, dated Jun. 21, 2018, 9 pages.

Notice of Reason for Rejection for JP 2015-121671, dated Nov. 7, 2018, 7 pages.

U.S. Appl. No. 61/521,604, filed Aug. 9, 2011, in the names of Robert B. Lowrance et al., entitled "Apparatus and Methods or Control of Print Gap." pp. 1-27. (Year: 2011).

U.S. Appl. No. 61/521,631, filed Aug. 9, 2011, in the names of Robert B. Lowrance et al., entitled "Face-Down Thermal-Jet Printing Apparatus and Methods." pp. 1-51. (Year: 2011).

U.S. Appl. No. 61/728,358, filed Nov. 20, 2011, in the names of Stephen R. Forrest et al., entitled "Substrate Barrier Structure for Use with Organic Vapor Jet Printing." pp. 1-35. (Year: 2011).

* cited by examiner

APPARATUS AND METHOD TO DELIVER ORGANIC MATERIAL VIA ORGANIC VAPOR-JET PRINTING (OVJP)

CROSS-REFERENCE TO RELATED APPLICATIONS

This application is a non-provisional of, and claims priority to, U.S. Provisional Patent Application Ser. No. 62/240,198, filed Oct. 12, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to assemblies for organic vapor jet deposition of organic materials and the like, and devices such as organic light emitting diodes and other devices, fabricated at least partially by the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

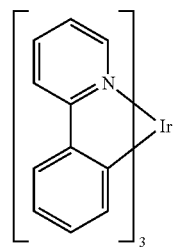

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an apparatus for organic vapor deposition of an organic material is provided, which includes an injection block and one or more source material crucibles that can be removeably attached to the injection block without the use of an intervening physical channel such as a feedtube. The injection block may include a carrier gas chamber in fluid communication with a carrier gas source and a nozzle assembly in fluid communication with the carrier gas chamber. When each source material crucible is attached to the injection block, the corresponding source chamber of the source material crucible may be in direct fluid communication with the carrier gas chamber and the internal flow path between the source chamber and the carrier gas chamber may be not more than 2 mm and, in some cases, zero. The crucible also may be physically supported by the injection block when attached to the injection block. The injection block may be formed from a monolithic block of material. Each crucible may include a heater, such as a cylindrical aluminum nitride heater or other heating device. Alternatively, a heater may be removeably attached to the crucible before or after the crucible is attached to the injection block. When a crucible is connected to the injection block, all gas flow paths between the crucible and the injection block may be completely internal to the apparatus.

In an embodiment, a crucible may include a cover disposed over the source material chamber of the crucible, which forms a gasket seal with the injection block when the crucible is attached to the injection block. The cover may be hermetically sealed over the first source material chamber, for example to allow for transport and/or storage of the crucible with the organic material contained within the crucible. The injection block may include an injection tube that pierces the cover when the crucible is attached to the injection block.

In an embodiment, multiple crucibles may be attached to the injection block, each of which may contain an organic material that is the same as, partially the same as, or different from organic material in one or more other crucibles attached to the injection block, thereby allowing for deposition of the same, different, or partially different materials, such as different concentrations of the same material in different mixtures.

In an embodiment, the crucible may be fabricated from aluminum, titanium, nickel, molybdenum, tungsten, and/or ceramic materials.

In an embodiment, an OVJP material crucible is provided that includes a crucible chamber containing an organic material capable of being deposited via OVJP. The crucible may be fabricated from essentially only aluminum, only aluminum, or aluminum, titanium, nickel, molybdenum, tungsten, and/or ceramic materials. A cover may be disposed over and hermetically seal the material crucible. The crucible may be used in conjunction with an injection block as previously disclosed.

In an embodiment, a method is provided that includes physically attaching a first source material crucible to an injection block without the use of an intervening external physical channel, where the first source material crucible comprises a first source material chamber containing a first organic material. When the first source material crucible is attached to the injection block, the first source chamber is in direct fluid communication with a carrier gas chamber of the injection block. The method may further include heating the first source material crucible to at least partially vaporize the first organic material, providing a carrier gas to the injection block, and operating the injection block to deposit the first organic material over a substrate. One or more additional source material crucibles may be attached to the injection block without the use of any intervening external physical channels, such that when the second source material crucible is attached to the injection block, the second source chamber is in direct fluid communication with a carrier gas chamber of the injection block. Each crucible may be heated independently to vaporize organic material contained in the crucible, and the injection block may be operated to deposit the corresponding organic material over the substrate.

DETAILED DESCRIPTION

Generally, an OLED comprises at least one organic layer disposed between and electrically connected to an anode and a cathode. When a current is applied, the anode injects holes and the cathode injects electrons into the organic layer(s).

The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
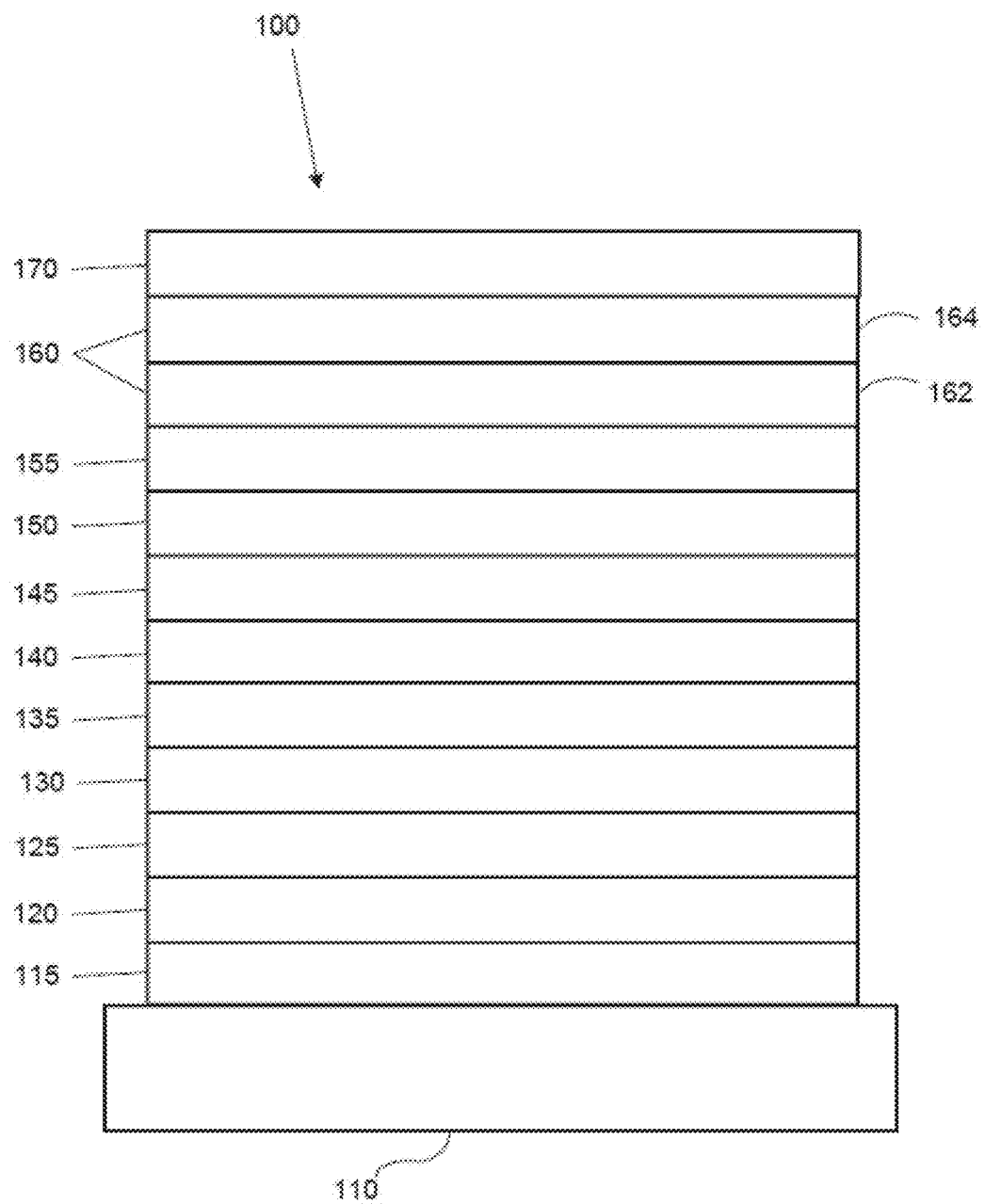
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
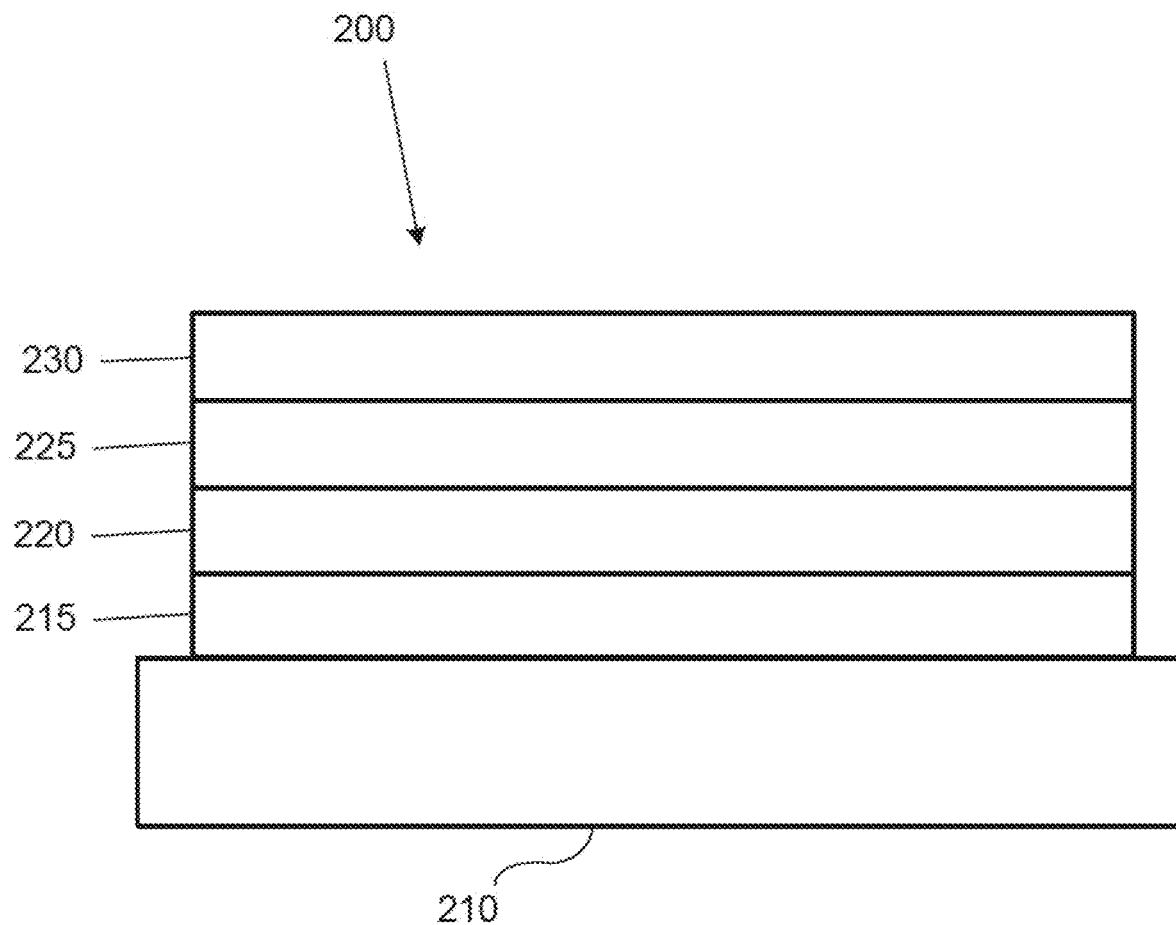
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, virtual reality displays, augmented reality displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

As previously described, OVJP may be used, for example, for printing well defined lines of organic material without the use of fine metal masks (shadow masks). Fine metal masks often are costly and a source of yield loss in display production due to mask deformation, particle formation and misalignment.

Figure 3:
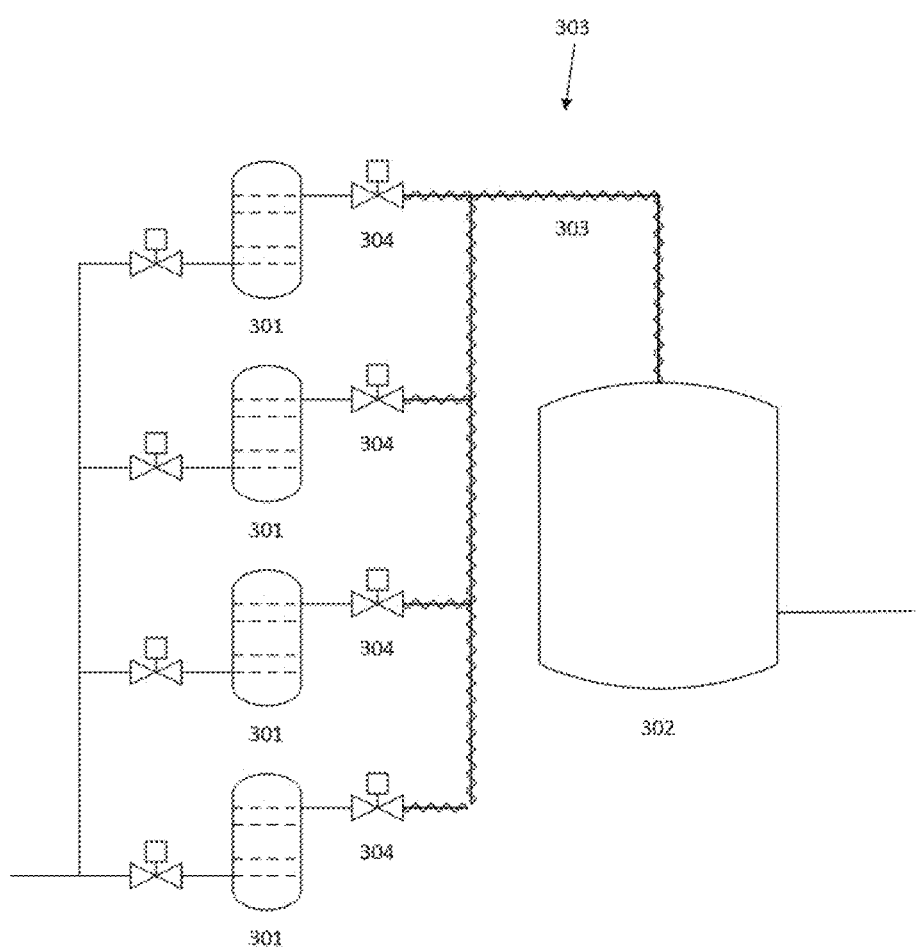
FIG. 3 shows an example of an OVJP system that uses external vapor source ovens connected to a deposition tool via feedlines.

The vapor source for OVJP and related techniques usually includes a heated enclosure containing a crucible charged with a condensed organic source and inlet and outlet ports for an inert carrier gas. The carrier gas, also referred to as a delivery gas, entrains the vapor generated in the crucible and convectively carries it downstream to a print head that deposits thin film features on a substrate. It may be mixed with vapors from other sources during transit if the desired film has multiple components. Prior implementations of OVJP featured sources and print heads that were contained in separate structures and connected with tubes, referred to as runlines. An example of such a system is shown in FIG. 3. The organic vapor sources 301 are arranged external to a deposition chamber 302 containing the print head. The heated runlines 303 typically must be run inside the deposition chamber 302. Conventional runline heating schemes often suffer from poor reliability, uneven heat distribution, and excessive outgassing.

Maintaining a uniform temperature profile in runlines such as the runlines 303 shown in FIG. 3 may be very difficult. The presence of a cold spot in the runline may trap organic vapor and thereby reduce the amount that reaches the substrate, leading to slower printing. Cold spots generally do not affect all components of a vapor mixture evenly, so they can also have an unpredictable effect on doping levels. Additionally, material trapped in cold spots may contaminate future runs when it does desorb. Hot spots are also detrimental because they promote thermal degradation of the organic vapor. Even when properly heated, the surface of the tubing must come into adsorption-desorption equilibrium with the vapor it contains before the system reaches steady state. Tubes may have lengths on the order of a meter and equilibration may take an hour or more. To limit cold spots and wall interactions, the runlines must be maintained at a temperature higher than the sublimation temperature of the least volatile component of the vapor mixture being deposited. Accordingly, high-temperature valves 304 may be required around the source enclosures to achieve positive shutoff. These valves are unreliable and can, themselves, form cold spots.

Embodiments disclosed herein provide systems, including an organic material source, an injection block, and print head designs for an organic vapor deposition system that reduces or entirely eliminates the need for heated runlines present in conventional OVJP systems.

Figure 4:
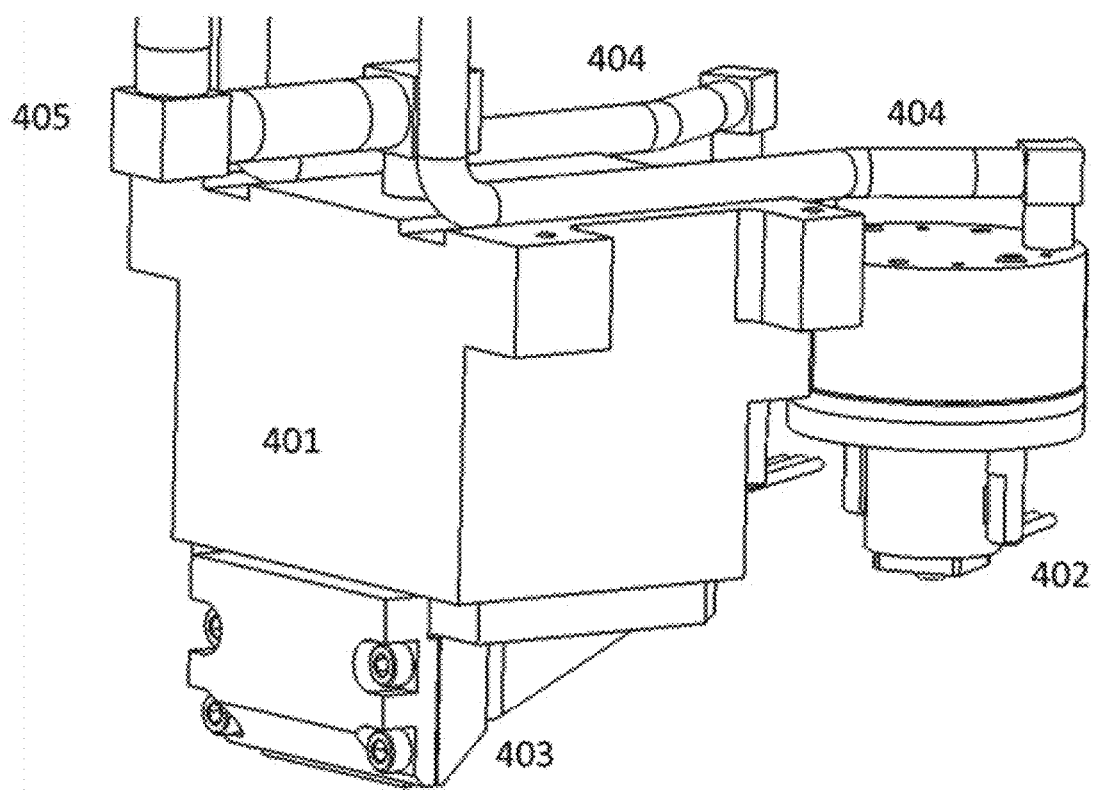
FIG. 4 shows an example of an OVJP deposition tool including a monolithic injection block that can be placed inside the deposition chamber according to an embodiment of the invention.

An example of an OVJP deposition system according to an embodiment is shown in FIG. 4. The injection block 401 is a manifold that may be positioned inside the deposition chamber during use. It serves as an attachment point for one or more source crucibles 402 and a print head 403 that distributes organic vapor over a substrate, i.e., either directly onto the substrate, or onto another layer disposed over the substrate. The injection block may include one or more tubing connections 404 for providing a delivery gas to the crucibles 402, which may be preheated by the injection block before introduction to the crucible assemblies 402. Multiple delivery gas lines may be used if multiple source crucibles are used.

In an embodiment, the injection block 401 may convey delivery gas laden with organic material vapor to the print head 403, which then deposits the organic material over the substrate. An exhaust line 405 from the print head also may pass through the injection block.

The injection block 401 may be a monolithic structure having a large thermal mass and low surface area for a uniform temperature distribution. For example, the injection block may be formed from a solid block of material. Organic vapor in the delivery flow may not experience cold spots and, as a result, organic vapor in the exhaust may not condense inside the block. It may be preferred for the injection block 401 to be fabricated from a solid piece of metal. For example, drillings in and through the injection block may be used to form the gas flow paths disclosed herein. Alternatively, a modular configuration may be used in which the injection block is formed from multiple components that are assembled into a monolithic structure prior to use.

Although FIG. 4 and related drawings provided herein show an assembly including two crucibles for ease of illustration, any number of crucibles may be used, including one, two, three, four, or more. Each crucible may include an organic material that may be the same, partially the same, or different than the organic material in each of the other crucibles attached to the assembly at any time. Similarly, each crucible may be heated independently and to the same or different temperatures, to allow for use of similar or different organic materials at the same time.

Figure 5:
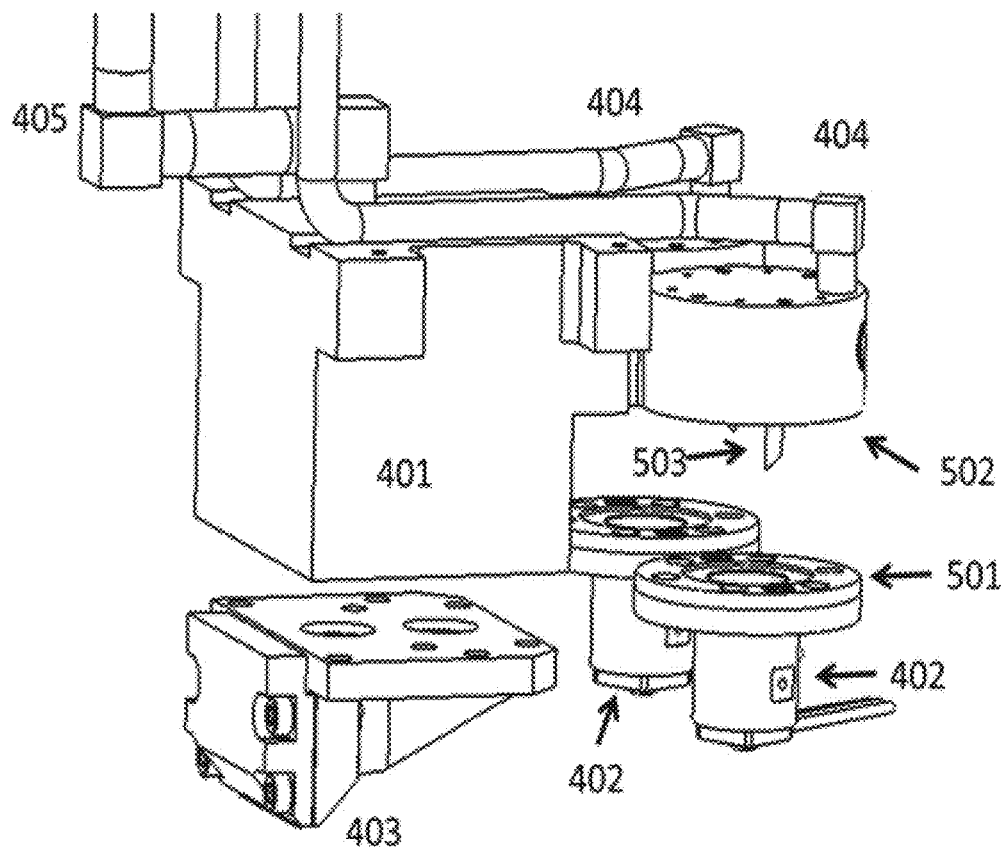
FIG. 5 shows components of the injection block and source assembly shown in FIG. 4.

FIG. 5 shows a schematic view of the assembly shown in FIG. 4 with the print head 403 and source crucibles 402 separated from the injection block 401. In contrast to conventional OVJP arrangements, the organic sources 402 are close-coupled to the injection block, as opposed to being separate source cell vessels that are connected to other components with heated runlines, such as shown in FIG. 3. Source crucibles 402 as disclosed herein may be attached directly to the injection block 401, for example, via support rings 501 around the source crucibles. In such a configuration, the weight of the source crucible is physically supported by the injection block. The attachment face 502 on the underside of the injection block 401 forms the upper "ceiling" surface of the source cell cavity containing the condensed organic material when the source 402 is sealed to the injection block 401.

In an embodiment, the injection block 401 may include one or more injector tubes 503. Such a tube may guide source gas from the injection block 401 into the crucible 402 where it can pick up organic vapor from the condensed phase. In such a configuration, the source may be an integrated structure, containing elements from both the crucible assembly and the injection block.

Figure 6:
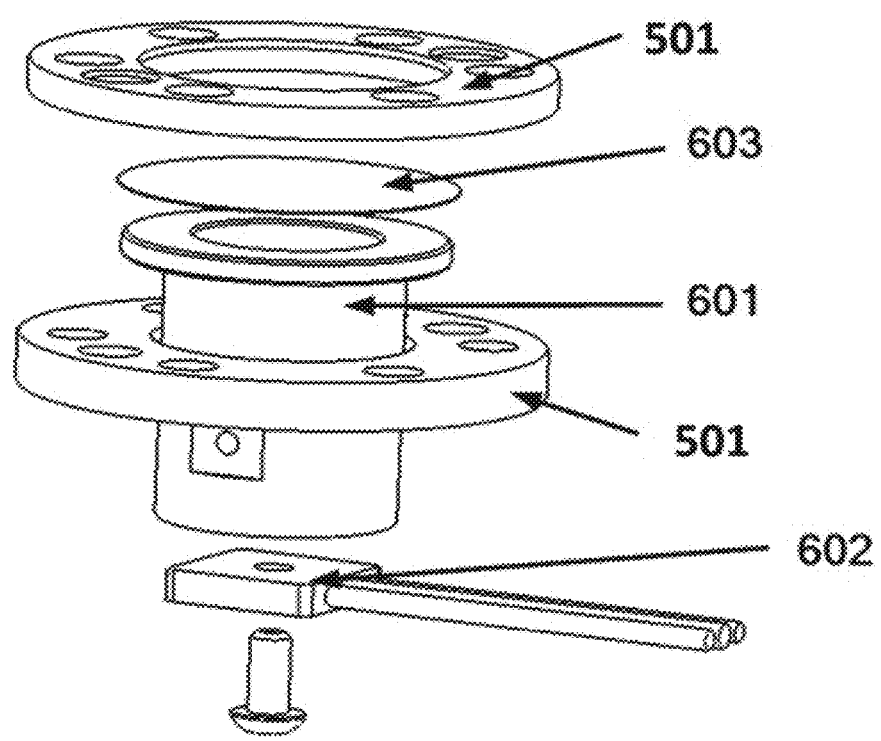
FIG. 6 shows the components of a source assembly according to an embodiment of the invention.

FIG. 6 shows an exploded view of a crucible assembly according to an embodiment. The crucible 601 may have a flared lip backed by a lower support ring and surrounded by an upper support ring.

In an embodiment, a membrane 603 may cover the top of the crucible. The membrane may be, for example, aluminum or a similar material, and may be hermetically sealed to the lip of the crucible 601. In other embodiments, the membrane may be any material that may hermetically seal the surface of the crucible, form a tight seal to the monolithic block and be thermally stable under the process conditions used to deposit the organic material contained in the crucible 601. The membrane may protect the condensed organic material from spillage or contamination during transport, and from environmental factors like humidity and oxygen during transport and storage. The membrane may be punctured by the injector tube 503 shown in FIG. 5 when the source crucible is installed in the injection block. Thus, in embodiments disclosed herein, organic material can be shipped, stored, and evaporated for deposition in the same container. In contrast to conventional OVJP organic source material configurations, such configurations may simplify organic material recharges, reduce or eliminate sources of process variability, and provide improved efficiency of use and re-use of organic material. Such configurations also may facilitate automated and/or in-situ reloading of a deposition tool.

In a preferred embodiment, a resistive heater 602 is placed in thermal contact with the base of the crucible 601. In other embodiments, the heater may be incorporated directly into the crucible body. For example, the crucible may be or include a cylindrical heater, such as a cylindrical aluminum nitride (AlN) heater. Each source material crucible 601 also may include, or may be in thermal contact with, a thermocouple configured to measure the temperature of the crucible.

The crucible 601 may be sealed to the injection block as previously disclosed by pressure from the lower support ring 501. In a preferred embodiment the crucible may be made partially, primarily, or entirely from aluminum. Aluminum or an equivalent material may be preferred because it is compliant and can readily seal to the gland on the injection block. Furthermore, the high thermal conductivity of aluminum allows for even heating of the crucible, such as by the heater 602. Aluminum is also relatively easy to machine or form, thus facilitating crucible fabrication.

Furthermore, surprisingly and contrary to conventional understanding in the OVJP field, it has been found that organic material stored in an aluminum crucible is not contaminated by prolonged contact with the aluminum surface, nor does the organic material react with the aluminum. This has been verified using material that had been stored in aluminum crucibles at process temperatures for an extended period of 6 weeks, to make OLEDs with vacuum thermal evaporation. The OLED device grown with stored material showed similar performance (color, voltage and efficiency) to that of a device grown with fresh material. When the devices were driven at a constant current density of 40 $mA/cm^2$, the times taken to reach 95% of initial luminance (LT 95) were comparable. The device made with the stored material had a LT 95 of 319 hours whereas the device made with fresh material had a LT95 of 290 hours. This experiment demonstrates that, surprisingly, OLED material storage in a heated aluminum crucible has no significant effect on its composition, since lifetime is a very sensitive indicator of material quality. Conventionally it has been believed in the OLED fabrication field generally, and with respect to OVJP techniques specifically, that aluminum would be poorly suited for use as a crucible material. More generally, an OVJP material crucible as disclosed herein may be fabricated from non-refractory metals as well as refractory metals more conventionally used in crucible construction. Metals with similar properties, like copper, may also be used to make crucibles. Other suitable materials include titanium, nickel, molybdenum, tungsten, ceramic, and combinations thereof.

Figure 7:
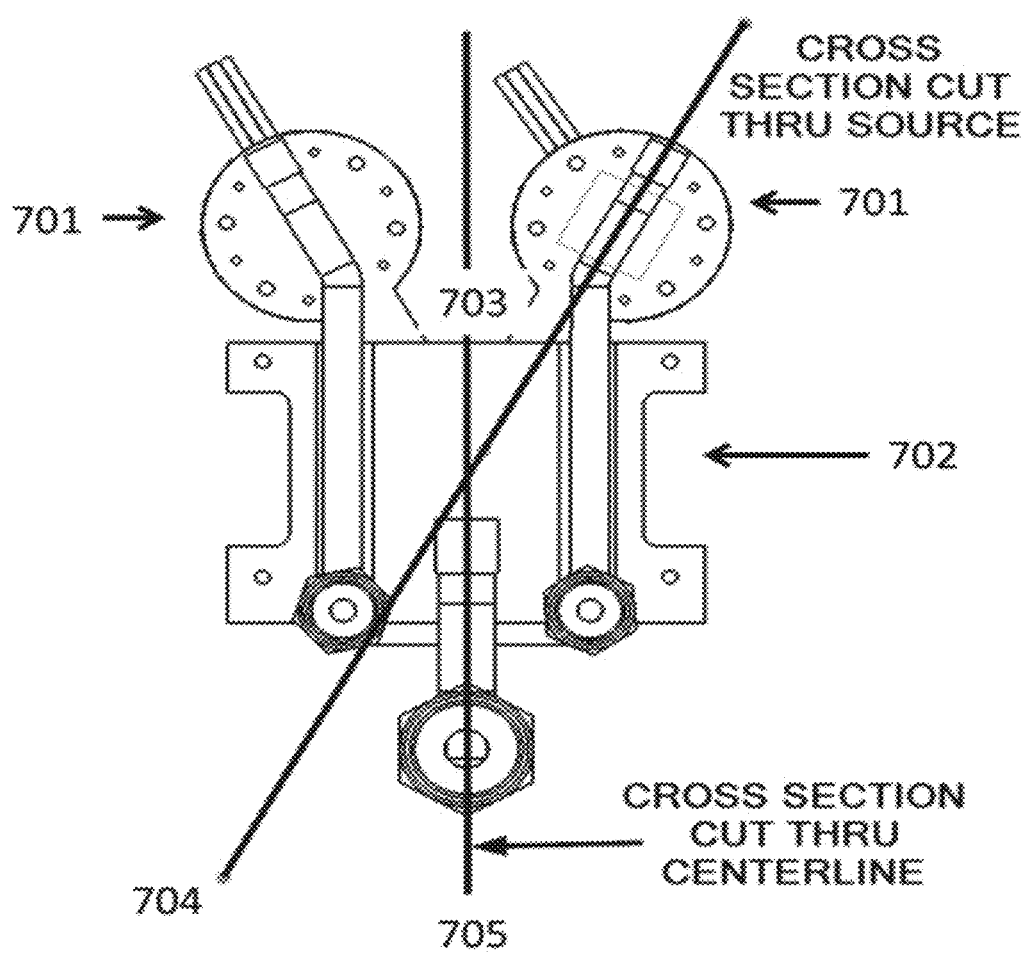
FIG. 7 shows a top view of an injection block according to an embodiment of the invention.

FIG. 7 shows a top view of an injection block according to an embodiment. Attachment points 701 for the source assemblies may be positioned to offer some degree of thermal isolation from each other and the central block 702. For example, different materials or combinations of materials may be placed in separate source crucibles attached to separate attachment points 701. This may permit, for example, controlled co-deposition of materials with different sublimation temperatures, since the two crucibles are sufficiently thermally isolated from one another that they may be maintained at different temperatures. The temperature distribution within each source crucible is relatively uniform, as is the temperature inside the central portion of the injection block 702. However, the relatively narrow neck 703 between these regions allows them to be held at different temperatures. The use of multiple crucibles may be desirable, for example, to allow rapid and efficient deposition of multiple layers of an OLED or similar device, different hosts and dopants or the same hosts and dopants in different concentrations, or any combination thereof. Furthermore, because the crucibles may be removed from the injection block, multiple materials may be deposited over a single substrate within a single chamber.

Figure 8:
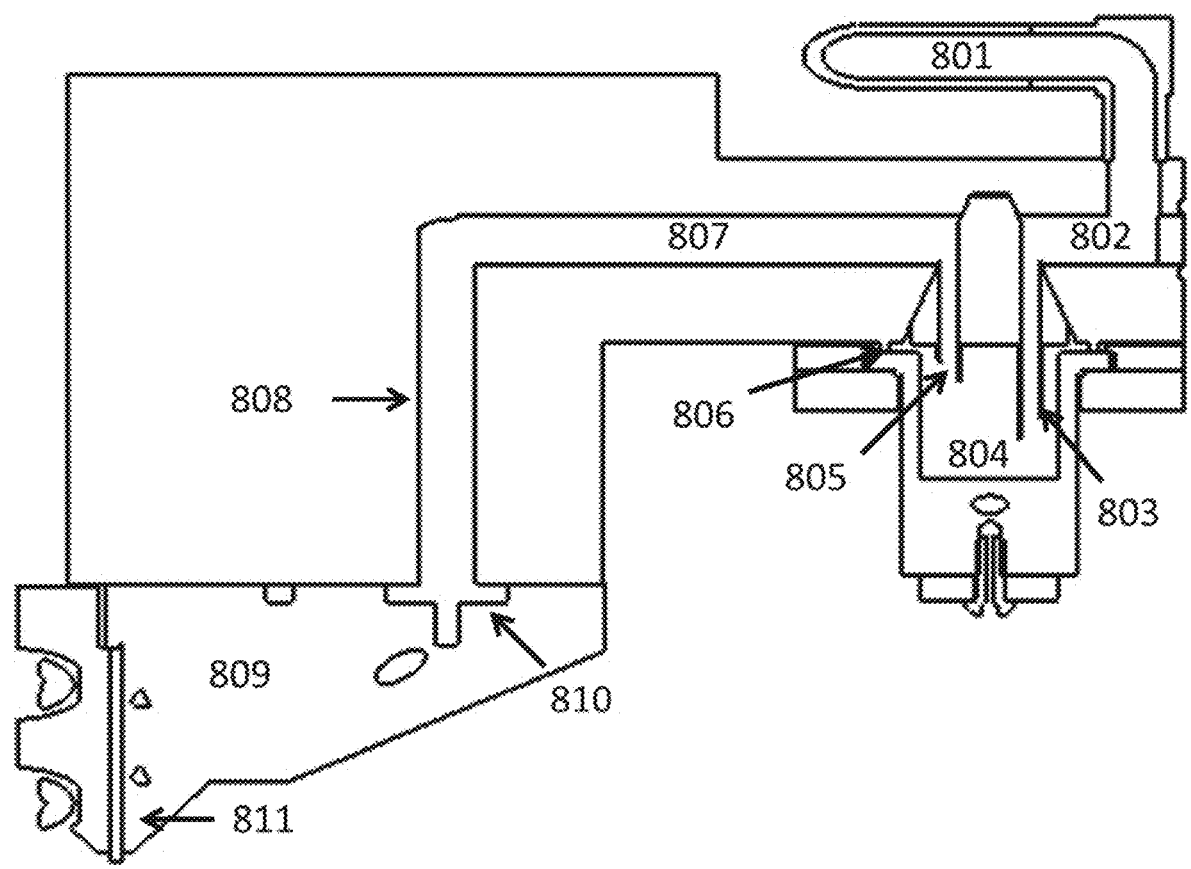
FIG. 8 shows a cross sectional view of the injection block shown in FIG. 7.

FIG. 8 shows a cross-section through line A-A' in FIG. 7. Delivery gas enters the injection block through a tube 801 that is welded to, or otherwise physically integral with the injection block. External tubes and the fittings connecting them to in-chamber components may not be heated, thus avoiding or reducing the likelihood of cold spots and other undesirable effects common in conventional OVJP systems as previously disclosed.

The delivery gas then flows through a channel 802 in the injection block to an injection tube 803 that leads to the inside of the crucible 804, where the condensed organic material is stored. Notably, the injection tube 803 is disposed entirely within the injection block and/or the crucible. That is, the internal flow path length between the crucible and the interior of the injection block is zero, since the interior of the crucible is in direct and immediate fluid communication with the channel 802, which essentially extends into the interior of the crucible via the injection tube 803. In some embodiments, the internal flow path may be relatively small but greater than zero; for example, 2 mm, 1 mm, or less. Thus, such a configuration also avoids the problems that occur with runlines in conventional OVJP systems.

The delivery gas picks up vapor and is collected by a siphon tube 805 leading downstream, which is also disposed entirely internally within the injection block and/or the crucible. The tips of both the injection and siphon tubes may be sharpened to puncture the membrane covering the crucible. An interface 806, such as between a gland milled into the crucible attachment point and the lip of the crucible, forms a seal between the organic vapor source (i.e., the interior of the organic material crucible) and the deposition chamber ambient.

A transfer channel 807 places the siphon tube in fluid communication with a mixing channel 808 leading to the print head. Transfer channels from multiple evaporation sources may meet at the top of the mixing channel 808, allowing for a delivery flow containing multiple organic vapor components to be delivered to the print head 809. Only a short length of about 2 cm is required for host and dopant vapors to mix. However, the delivery flow should be evenly mixed to deposit a high quality film. The injection block feeds delivery flow to the print head 809 and may withdraw exhaust flow via separate exhaust channels (not shown). As previously disclosed, the print head is supported by the injection block, but is detachable. Its fluidic connections 810 may be sealed by elastomer or soft metal gaskets or ferrules. The print head contains an apparatus such as a micronozzle array 811 (nozzle assembly) for printing the desired features on the substrate.

Figure 9:
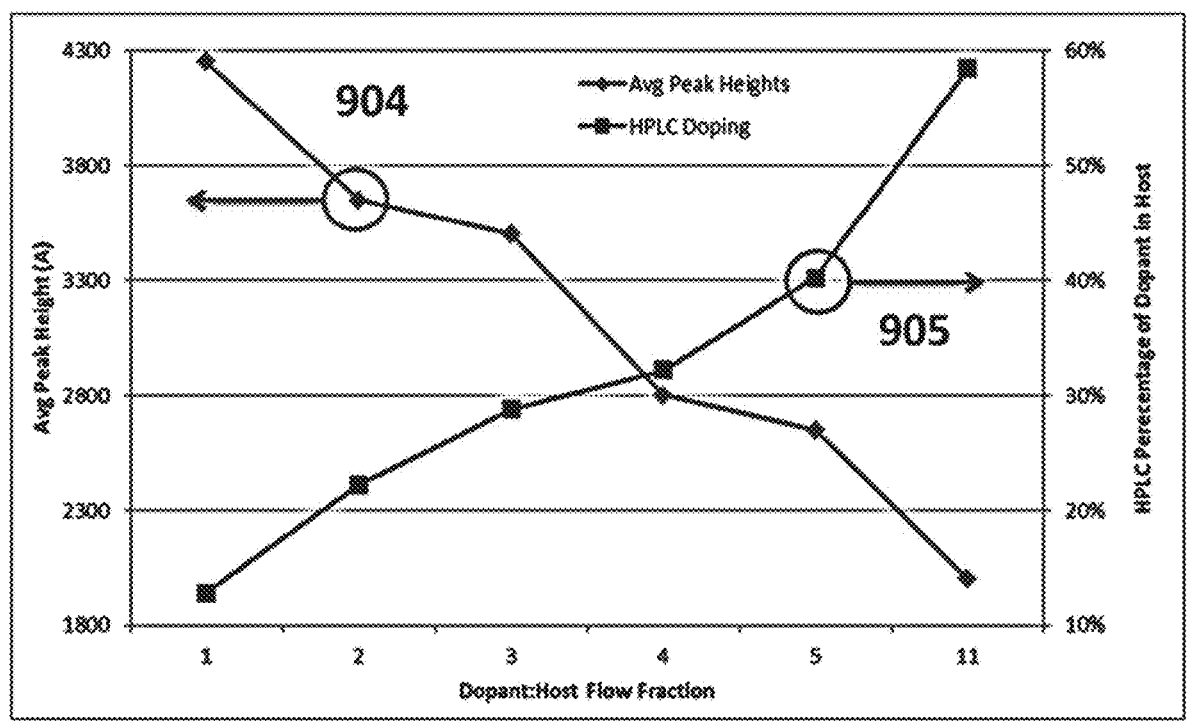
FIG. 9 shows the overall material deposition rate and mole fraction of dopant in a co-deposited film printed using an injection block and the disclosed source designs as a function of delivery gas flow according to an embodiment of the invention.

FIG. 9 shows a plot of the behavior of an OVJP deposition apparatus using an embodiment of the assemblies disclosed herein. A total delivery flow of 60 sccm is split between two sources, one containing an organic host material and the other containing an organic dopant. The horizontal axis shows the ratio of dopant to host delivery gas flow rate. The left vertical axis shows the deposition rate measured by the thickness of printed features in Angstroms (Å), and the right vertical axis shows the dopant fraction present in the printed features measured by high pressure liquid chromatography (HPLC). The overall deposition rate 904 trends downward as the flow to the dopant source is increased and flow to the host source is decreased. The rate of delivery gas flow through the host source is the primary determinant of deposition rate, since the fraction of host material in the film is much higher than that of the dopant. While overall deposition rate decreases as more of the delivery flow is directed through the dopant source, the dopant fraction in the printed films increases 905. The increase in dopant concentration in the printed material with dopant delivery flow fraction is roughly linear. More generally, the change in the amount of material contributed by each source to the resulting film is proportional to the change in the amount of flow through the source. This implies that delivery gas leaves each source in a nearly saturated state and the source design permits efficient mass transfer between the delivery gas and the condensed organic material charge in each crucible.

An advantage of evaporation sources that are close-coupled to the print head through a uniformly heated monolithic manifold as disclosed herein is that the transient response of the system to changes in process variables is very short, in contrast to the relatively long transient response times common in OVJP systems. For example, in the case of a co-deposited film, the ratio of host to dopant can be rapidly adjusted by changing the ratio of the delivery flow between the host and dopant sources, without the need for a lengthy readjustment period as is common in conventional OVJP systems.

Figure 10:
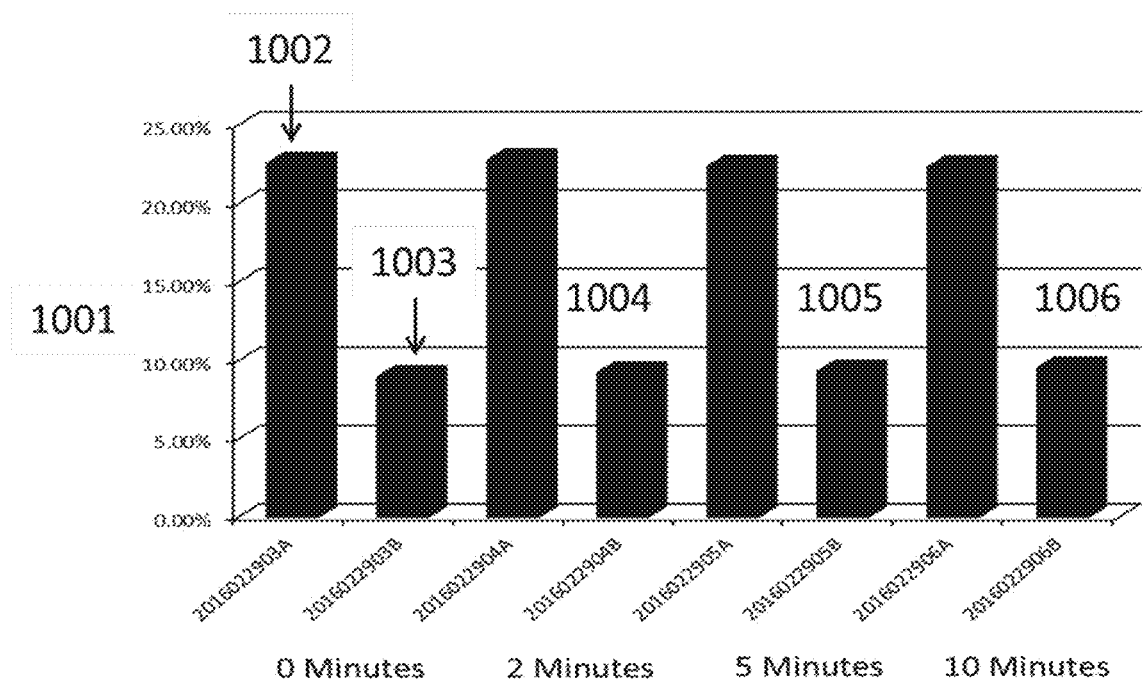
FIG. 10 shows the mole fraction of dopant in co-deposited films before and after changes in flow according to an embodiment of the invention.

FIG. 10 shows experimental data that confirms this advantage. The vertical axis 1001 indicates the fraction of dopant present in each deposited film, as measured by HPLC. The first bar on the left 1002 shows a film deposited with a host to dopant delivery flow ratio of 1:3. The adjacent bar to the right of it 1003 shows the film printed with the host to dopant delivery flow ratio of 7:5 immediately after the flows were adjusted. The subsequent pairs of bars 1004, 1005, 1006 show the doping ratios before and after changing host to dopant delivery flow ratios with lag times of 2, 5, and 10 minutes, respectively. The doping ratio changes significantly in response to the change in delivery flow ratio, but the response is independent of the lag time between changing the process conditions and printing the measured film. This implies that the transient response is on the order of a minute or less. In contrast, conventional OVJP deposition tools that use external tubing connecting the vapor sources and print head may have transient response times on the time scale of hours or more.

Embodiments disclosed herein allow for efficient deposition techniques for organic materials, without requiring the long transient times required by conventional OVJP systems, movement between multiple chambers, and/or the use of multiple deposition systems to deposit materials that embodiments disclosed herein allow to be deposited by a single system. For example, in an embodiment, a first organic material may be deposited over a substrate from a first crucible attached to an injection block as previously disclosed. Subsequently or concurrently, a second organic material, which may be partially or entirely the same as the first organic material, may be deposited over the substrate from a second crucible attached to the same injection block, or to a separate injection block disposed within the same deposition chamber as the first injection block. Alternatively or in addition, another crucible may be attached to the injection block, either in addition to or as a replacement of the first crucible. This crucible may contain the same or different materials as the first crucible, and may be attached to the injection block without removing the injection block from the deposition chamber. Each crucible and each injection block may be operated as previously disclosed herein.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An apparatus for organic vapor deposition of an organic material, the apparatus comprising:
   an injection block comprising:
      a carrier gas chamber in fluid communication with a carrier gas source; and
      a nozzle assembly;
      an interface that includes an injection tube and a siphon tube disposed on a first side of the injection block, away from a center portion located along a horizontal axis of the first side; and
      a first source material crucible removably attached to the injection block, the first source material crucible comprising a first source material chamber and a first crucible heater,
   wherein, when the first source material crucible is attached to the injection block at the interface such that the injection tube and the siphon tube pierce the first source material crucible to form a combined apparatus, the first source material chamber is in direct fluid communication with the carrier gas chamber via the injection tube, the first source material chamber is in direct fluid communication with a transfer channel and a mixing channel of the injection block via the siphon tube, wherein a gas flow path between the first source material crucible and the injection block is within the combined apparatus.

2. The apparatus of claim 1, wherein the injection block is a monolithic block of material.

3. The apparatus of claim 1, wherein the first source material crucible is physically supported by the injection block.

4. The apparatus of claim 1, wherein the first crucible heater is removably attached to the first source material crucible.

5. The apparatus of claim 1, wherein the first source material crucible comprises a cover disposed over the first source material chamber, and wherein the cover forms a gasket seal with the injection block when the first source material crucible is attached to the injection block.

6. The apparatus of claim 5, wherein the cover is hermetically sealed over the first source material chamber.

7. The apparatus of claim 5, wherein the injection tube pierces the cover when the first source material crucible is attached to the injection block.

8. The apparatus of claim 1, further comprising a second source material crucible removably attached to the injection block, the second source material crucible comprising a second source material chamber and a second crucible heater.

9. The apparatus of claim 8, wherein the first source material crucible contains a first organic source material, and the second source material crucible contains a second organic source material different from the first organic source material.

10. The apparatus of claim 9, wherein each of the first and second organic source materials comprise a mixture of the same components in different ratios.

11. The apparatus of claim 1, further comprising a plurality of source material crucibles removably attached to the injection block, each of the plurality of source material crucibles comprising a respective source material chamber.

12. The apparatus of claim 1, wherein the first source material crucible contains a mixture of organic source materials.

13. The apparatus of claim 1, wherein the first source material crucible comprises one or more materials selected from the group consisting of: aluminum, titanium, nickel, molybdenum, tungsten, and a ceramic.

14. The apparatus of claim 1, wherein all gas flow paths between the first source material crucible and the injection block are internal to the combined apparatus.

15. The apparatus of claim 1, wherein an internal flow path length is not greater than 2 mm.

16. The apparatus of claim 1, wherein the first source material crucible comprises a cylindrical aluminum nitride heater.

17. The apparatus of claim 1, wherein the first source material crucible comprises a thermocouple configured to measure the temperature of the first source material crucible.

18. An organic vapor jet printing (OVJP) material crucible, comprising:
   a crucible chamber containing an organic material capable of being deposited via OVJP, wherein the crucible chamber consists essentially of aluminum,
   wherein when the crucible chamber is attached to an injection block at an interface including an injection tube and a siphon tube disposed on a first side of the injection block away from a center portion located along a horizontal axis of the first side of the injection block such that the injection tube and the siphon tube pierce the crucible chamber, the crucible chamber is in direct fluid communication with an injection block and a gas flow path between the crucible chamber and the injection block via the injection tube is within a combined apparatus of the crucible chamber and the injection block, and the crucible chamber is in direct fluid communication with a transfer channel and a mixing channel of the injection block via the siphon tube.

19. The OVJP material crucible of claim 18, wherein the crucible consists entirely of aluminum.

20. The OVJP material crucible of claim 18, further comprising:
   a cover hermetically sealed over the crucible chamber.

* * * * *